United States Patent [19]

Takahashi

[11] Patent Number: 5,539,220
[45] Date of Patent: Jul. 23, 1996

[54] PRESSURE CONTACT SEMICONDUCTOR DEVICE IN A FLAT PACKAGE

[75] Inventor: Yoshikazu Takahashi, Kawasaki, Japan

[73] Assignee: Fuji Electric Co., Ltd., Hino, Japan

[21] Appl. No.: 280,618

[22] Filed: Jul. 26, 1994

[30] Foreign Application Priority Data

Jul. 27, 1993 [JP] Japan ................................. 5-184271
Feb. 28, 1994 [JP] Japan .................................. 6-28623

[51] Int. Cl.$^6$ .......................... H01L 23/051; H01L 23/10
[52] U.S. Cl. .......................... 257/177; 257/691; 257/724; 257/726; 257/785
[58] Field of Search .................................. 257/150–153, 257/177–182, 741, 785, 750, 753, 724, 688, 689, 690, 691, 723, 725, 726, 727

[56] References Cited

U.S. PATENT DOCUMENTS

| | | | |
|---|---|---|---|
| 4,313,128 | 1/1982 | Schlegel et al. | 257/785 |
| 5,221,851 | 6/1993 | Gobrecht et al. | 257/150 |
| 5,250,821 | 10/1993 | Ferla et al. | 257/177 |

FOREIGN PATENT DOCUMENTS

| | | | |
|---|---|---|---|
| 0428916 | 5/1991 | European Pat. Off. | |
| 0432796 | 6/1991 | European Pat. Off. | 257/178 |
| 0476661 | 3/1992 | European Pat. Off. | |
| 0499707 | 8/1992 | European Pat. Off. | |
| 0130955 | 5/1990 | Japan | 257/724 |

OTHER PUBLICATIONS

Patent Abstracts of Japan, Kokai Publication #4–160708 (Apr. 6, 1992) vol. 16 No. 453 (E–1267) Abstract date Aug. 21, 1992.

*Primary Examiner*—Peter Toby Brown
*Attorney, Agent, or Firm*—Brumbaugh, Graves, Donohue & Raymond

[57] ABSTRACT

A module-type semiconductor device in which a plurality of IGBTs are incorporated in a package in such a way so as to provide a highly reliable pressure contact type semiconductor device having improved heat dissipation performance and small internal wiring inductance. A plurality of IGBTs are incorporated and arranged in a flat package with a hermetic structure consisting of common electrode plates exposed to top and bottom face sides, and an insulating outer frame interposed between the common electrodes plates and seal-joining those electrode plates. Contact terminal bodies which serve as both pressing members and heat radiators are interposed between the top-face-side common electrode plate and emitter electrodes of the respective opposing IGBTs. The emitter electrodes of the IGBTs and the common electrode, and the collector electrodes and the bottom-face-side common electrode, are directly brought in pressure contact with each other. Gate electrodes of the respective IGBTs are individually connected to a gate wiring conductor located on an inner wall of an insulating outer frame by gate wire leads.

12 Claims, 3 Drawing Sheets

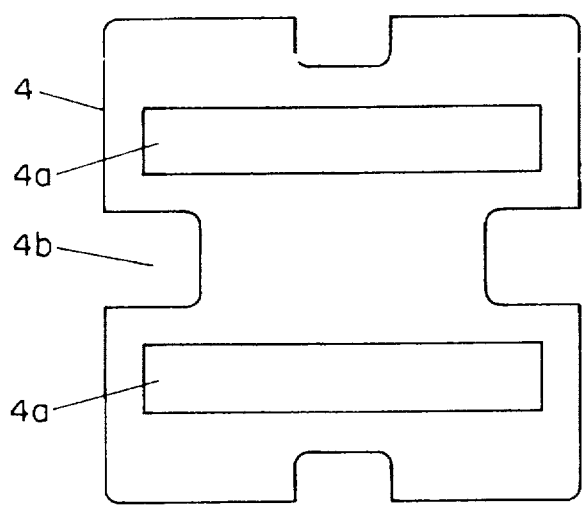
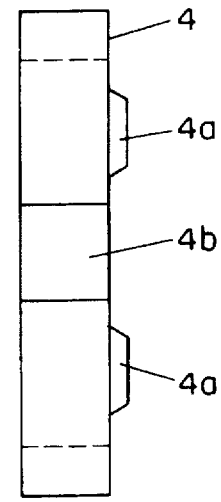
FIG. 3A        FIG. 3B
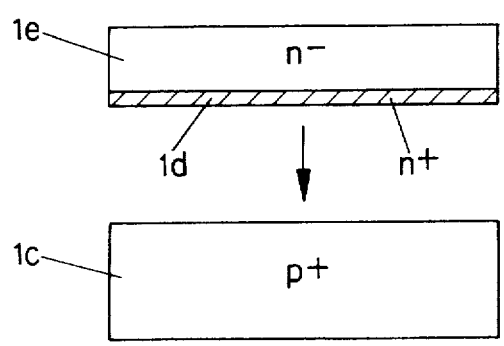
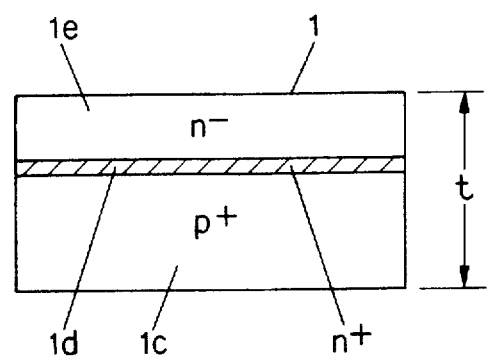
FIG. 4A        FIG. 4B
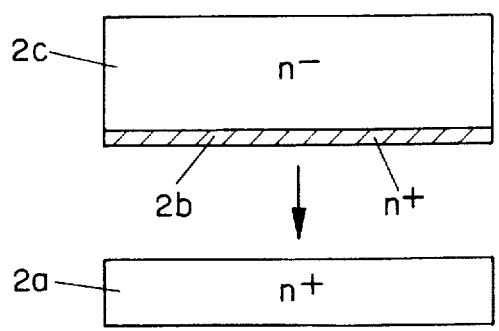
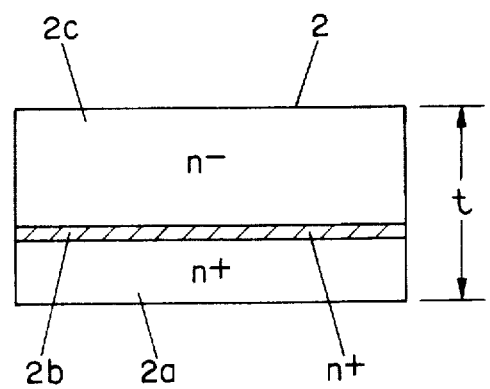
FIG. 5A        FIG. 5B

PRESSURE CONTACT SEMICONDUCTOR DEVICE IN A FLAT PACKAGE

TECHNICAL FIELD

The present invention relates to a pressure contact type semiconductor device in a flat package, in which a plurality of semiconductor elements, each having a first main electrode (emitter) and a control electrode (gate) on one principal surface of a substrate, and a second main electrode on another principal surface. The invention also relates to an assembling method for such a semiconductor device.

BACKGROUND

Insulated-gate bipolar transistors (IGBT) have been widely applied as power switching devices, motor PWM control inverters, etc. In general, the capacity of an IGBT increases with its size. Recently, in order to increase the capacity, a plurality of IGBTs are incorporated in a module structure within a package.

In a conventional package assembly for an IGBT-based semiconductor device, an emitter electrode as a main electrode and a gate electrode as a control electrode are placed side by side on a first principal surface of the device. A collector on a second principal surface is directly mounted on a metal base that also serves as a heat radiator. The emitter electrode and the gate electrode on the first principal surface must be connected to the exterior by separate external lead terminals. As a result, a conventional package assembly structure requires not only the metal base on the collector side, but also external lead terminals for the emitter and gate electrodes on the top part of the package. The connection of the emitter and gate electrodes to the external lead terminal is generally accomplished by wire bonding with an aluminum wire of approximately 300 μm in diameter.

With the above-described conventional assembly structure, although heat dissipation is sufficient on the collector side, virtually no heat dissipation occurs at the emitter side. Such a lack of heat dissipation at the emitter side greatly reduces the current capacity of the IGBT. Moreover, an IGBT module having a large current capacitance normally includes a myriad of IGBT's, resulting in as many as several hundred bonding wires connected to the collector electrode. The large number of bonding wires cause a high level of internal wiring inductance, which may result in a large voltage surge during a switching operation of the IGBT module.

In an attempt to solve heat dissipation and internal inductance problems due to the above-described assembly structure, it is conceivable, as in the case of the conventional pressure contact type semiconductor device, to incorporate an IGBT in a flat package, where the collector and emitter electrodes that are formed on its respective principal surfaces are in planar contact with the respective top and bottom electrode plates of the package. However, such an IGBT is constructed such that the emitter electrode extends over an insulating layer that covers the gate electrode. When the electrode plates are brought in pressure contact with the emitter electrode, the plates also exert a pressure on the gate electrode, possibly resulting in destruction of the gate electrode structure. Thus, the above pressure contact type assembly structure is not practical.

Furthermore, where a pressure contact type flat package is used in a composite device in which an IGBT and a freewheel diode are incorporated in a package, additional problems arise. First, the wafer thicknesses of the IGBT and the freewheel diode, as required from electrical characteristics, are different from each other. When these different types of semiconductor elements of different thicknesses are incorporated side by side in a flat package, there occurs a difference in heights of the elements. That is, the electrode surfaces of the two semiconductor elements are uneven and form a step opposite the electrode plate of the package which is normally brought into planar contact with the respective semiconductor elements. Because of the unevenness of the surfaces of the elements, the electrode plate does not exert a uniform pressure on them. It is known from experiments that, if the difference between the heights of the semiconductor elements is not within ±50 μm, the heat dissipation performance and the electrical characteristics of the semiconductor device are much deteriorated.

In addition, while conventional IGBTs generally use a wafer (called "epitaxial wafer") that is formed by sequentially growing n+ and n− layers on a p+ silicon substrate by epitaxy to attain desired switching characteristics, freewheel diodes use a wafer that is formed by growing an n+ layer by epitaxy on an n− silicon substrate that is normally produced by an FZ or MCZ method to reduce the cost. In the epitaxial wafer and the FZ or MCZ wafer, the thickness of the n− layer is set at an optimum value which produces the desired operating characteristics.

In the epitaxial wafer employed in the IGBT, a highly doped substrate is used as the p+ silicon substrate so that its small resistance has virtually no effect on the saturation voltage. The thickness of the p+ substrate is set to secure the required strength. On the other hand, in the diode using the FZ or MCZ wafer, the n+ epitaxial layer formed on the n− silicon substrate is thin and, therefore, the total thickness of the substrate is primarily determined by the thickness of the n− layer. As a result, the IGBT generally has a greater height than the freewheel diode, and their surfaces are uneven when placed side by side on a flat electrode plate for assembling.

For the foregoing reasons, there is a need for a pressure contact type semiconductor device, and an assembly method thereof, which incorporates a plurality of IGBTs in a flat package, and which provides improved heat dissipation, and a small internal wiring inductance. There is a further need for a composite device in which an IGBT and a freewheel diode are incorporated in a flat package, and which provides uniform pressure contact between the semiconductor elements and a common electrode plate of the package to avoid deterioration of their operating characteristics.

SUMMARY

The present invention is directed to a pressure contact type semiconductor device in a flat package, and a package assembly structure thereof, having improved heat dissipation performance and a small internal wiring inductance. It is further directed to a composite device which incorporates at least two different types of semiconductor elements, such as an IGBT and a freewheel diode, in a flat package, in such a way that uniform pressure contact is achieved between the semiconductor elements and a common electrode plate of the package without deteriorating operating characteristics.

A first objective is achieved by a pressure contact type semiconductor device which contains a plurality of semiconductor elements, each having a first main electrode and a control electrode on a first principal surface and a second main electrode on a second principal surface. These semiconductor elements are placed side by side in the flat package, including an insulating outer frame between a pair of common electrode plates, which is exposed to both faces by seal-joining. Contact terminal bodies, serving as both pressing members and heat radiators, are interposed between the first main electrodes of the respective semiconductor elements and the opposing common electrode plate of package. The control electrodes of the respective semiconductor elements are wire-connected to a control electrode wiring conductor which is on an inner periphery of the package. An external lead terminal for the control electrodes is led outside of the package through the wiring conductor.

A second objective is achieved by a pressure contact type semiconductor device as described above in which the semiconductor elements are made of insulated-gate bipolar transistors. The semiconductor device is assembled such that a freewheel diode is placed adjacent to the plurality of IGBTs in the flat package. Contact terminal bodies serving as both pressing members and heat radiators are interposed between the first main electrodes of the IGBTs and the freewheel diode, and the opposing common electrode plate of the package.

The above pressure contact type semiconductor device may be assembled in specific forms as described below.

(1) A positioning plate is incorporated in the flat package and is used for holding in place the respective contact terminal bodies that are in contact with the first main electrodes of the respective semiconductor elements.

(2) An indentation is formed in a peripheral portion of the contact terminal body, and is used for avoiding contact with a connection wire leading from the control electrode of the semiconductor element.

(3) The control electrode wiring conductor is formed on an inner wall of the insulating outer frame of the flat package so as to surround the semiconductor elements, and the external lead terminal connected to the control electrode wiring conductor is led outside of the package by penetrating through the insulating outer frame.

(4) A bonded wafer formed by bonding a highly doped silicon substrate on the side of the second principal surface is adopted in each of the insulated-gate bipolar transistors and the freewheel diode so that the semiconductor elements have the same height.

(5) A substrate for electrodes is provided on the common electrode plate of the package which is opposed to the second principal surfaces of the respective semiconductor elements. Grooves are formed around the chip mounting areas on the substrate for electrodes, and assembling guides for holding the contact terminal bodies in place are fitted in and fixed to the grooves. In assembling the device, the semiconductor elements and the contact terminal bodies are held in place with the assembling guides serving as guides.

(6) The second principal surfaces of the respective semiconductor elements and the opposing electrode plate are bonded to each other by interposing thermoplastic conductive sheets, such as solder sheets.

(7) Solder reliefs in the conductive sheets of item (6) are formed in portions of the grooves of item (5).

(8) Further, as an assembling method of the semiconductor device as in item (6), a pressing operation is performed on the first principal surfaces of all semiconductor elements while the conductive sheets are heated in a temporarily assembled state in which the thermoplastic conductive sheets, the semiconductor elements and the contact terminal bodies are inserted into the package. The conductive sheets are malleably deformed by the pressing force so that top faces of the respective chips are arranged to be on the same plane with the same height.

When the pressure contact type semiconductor device is assembled as described above, the main electrode for each of the plurality of semiconductor elements incorporated in the flat package is brought in pressure contact with the contact terminal body that is interposed between the first principal surface of the semiconductor elements and the common electrode of the package opposed thereto so as to avoid interference with the control electrode. It is also in plane contact with the main electrode. Consequently, heat dissipation to the exterior occurs at the first principal surface side through the contact terminal body, without exerting undue pressure on the control electrode structure of the semiconductor element. Combined with the heat dissipation on the second principal surface side, the overall heat dissipation performance is greatly improved, thus enabling an increase in the current capacity of the semiconductor device. Furthermore, since the main electrodes of the semiconductor elements are directly connected to the terminal bodies by plane contact without using bonding wires, the internal wiring inductance is reduced as compared to when bonding wire is used. Since the control electrodes are wire-connected to the wiring conductor, which is on the inner periphery of the package and surrounding the semiconductor elements, connection to the control electrodes can take place laterally without causing interference with the contact terminal bodies that are in pressure contact with the main electrodes.

Additionally, if the bonded wafers are used in conjunction with the plurality of IGBTs and the freewheel diode in a pressure contact type composite device (IGBT module) in a flat package, and if the thicknesses of the bonded wafers are properly adjusted, the heights of all the semiconductor elements can be equalized without deteriorating their electrical characteristics. By incorporating the IGBTs and the freewheel diode having the same height in the flat package, the top faces of both are at the same height. As a result, uniform pressure contact can be obtained between the IGBTs and freewheel diode, and the common electrode plate of the package through the contact terminal bodies of equal thickness.

When the plurality of IGBTs or the IGBTs and the freewheel diode are incorporated side by side in the single package, the thermoplastic conductive sheets, such as solder sheets, are interposed between the second principal surfaces of the respective semiconductor elements and the electrode plate opposed thereto. In this temporarily assembled state, the conductive sheets are heated and a pressing operation is effected on the first principal surfaces of all chips. As a result, the conductive sheets are malleable so as to absorb a difference in height between the IGBTs and the freewheel diode and variations in height among the respective chips so as to equalize the heights of the top faces of the respective semiconductor chips. Therefore, uniform pressure contact can occur between the common electrode plate of the flat package and the respective semiconductor elements incorporated in the package.

Furthermore, in the above case, the assembling guides, made of an insulating material and used for positioning purposes, serving to hold the semiconductor elements, the contact terminal bodies, and the conductive sheets at their predetermined assembling positions are incorporated in the package. The grooves, within which the assembling guides are fixed, are formed in the conductive substrate provided on the common electrode plate of the package opposed to the second principal surfaces of the semiconductor elements. The solder reliefs, which accommodate bulging portions of the conductive sheets (solder sheets) due to the heat deformation, are formed adjacent to the grooves. As a result, the respective parts such as the semiconductor elements and the contact terminal bodies are stably held in place during assembly of the package while interference between the respective semiconductor elements due to the heat deformation of the conductive sheets is prevented.

BRIEF DESCRIPTION OF THE DRAWING

Further objects, features and advantages of the invention will become apparent from the following detailed description taken in conjunction with the accompanying drawing, in which.

FIG. 3A shows a bottom view of a structure of a contact terminal body in the device of FIG. 1;

FIG. 3B shows a side view of the structure of the contact terminal body;

FIG. 4A illustrates a bonded wafer of an IGBT in the device of FIG. 1 before bonding thereof;

FIG. 4B illustrates the bonded wafer of the IGBT after bonding thereof;

FIG. 5A illustrates a bonded wafer of a freewheel diode in the device of FIG. 1 before bonding thereof;

FIG. 5B illustrates a bonded wafer of the freewheel diode after bonding thereof;

Throughout the figures of the drawing, the same reference numerals and characters are used to denote like features, elements, components or portions of the illustrated semiconductor devices.

DETAILED DESCRIPTION

Figure 1:
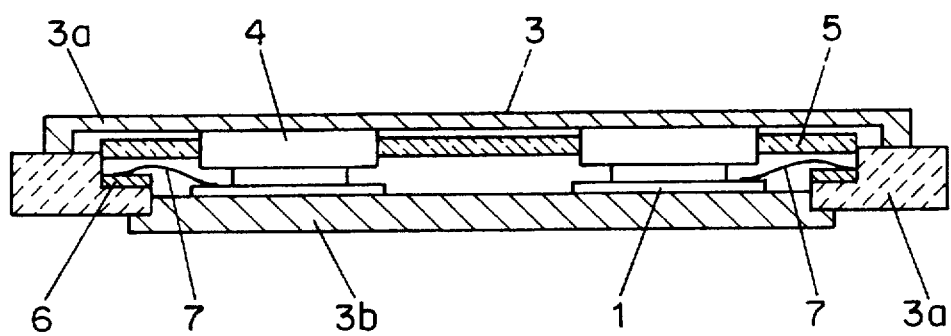
FIG. 1 shows a cross-section of an assembled structure of a first embodiment of a pressure contact type semiconductor device in a flat package according to the present invention.
Figure 2:
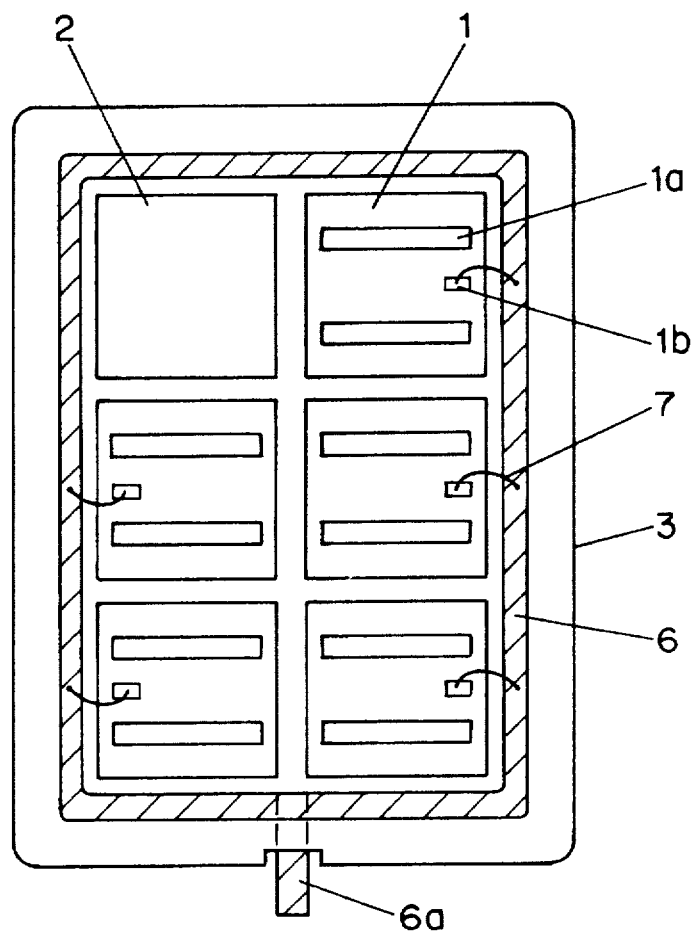
FIG. 2 is a planar view showing an arrangement of components of the semiconductor device of FIG. 1.

FIGS. 1 and 2 show a pressure contact type IGBT module embodying the principles of the invention. In this illustrative module, five IGBTs 1 and a freewheel diode 2 are placed side by side in a flat package. The IGBTs 1 and the freewheel diode 2 are assembled in a pressure contact type flat package 3. A silicon substrate of each IGBT 1 measures about 20 mm×20 mm. The bottom principal face comprises a collector. On the top principal face, two strips comprising emitter electrodes 1a each have a width of about 2 mm and a length of about 16 mm. These emitter electrodes 1a are placed so as to avoid a gate structure with a gate electrode 1b formed between them. The freewheel diode 2 is placed adjacent to the IGBTs 1 in the flat package 3 such that the top face and the bottom face of the silicon substrate become the anode and cathode, respectively.

As shown in FIGS. 4 and 5, the silicon substrates of the IGBT 1 and the freewheel diode 2 are produced from bonding type wafers so that the total thicknesses of those substrates are equal. More specifically, as shown in FIGS. 4A and 4B, the silicon substrate of the IGBT 1 is formed such that an n− wafer 1e having an epitaxially grown n+ layer 1d is bonded to a p+ wafer made of a highly doped silicon substrate 1c as a base. The total thickness of the substrate is t. On the other hand, as shown in FIG. 5A and 5B, the silicon substrate of the freewheel diode 2 is formed such that an n− wafer 2c having an epitaxially grown n+ layer 2b is bonded to an n+ wafer made of a highly doped silicon substrate 2a. The thickness of the n+ wafer 2a a is adjusted so that the total thickness (t) becomes equal to that of the silicon substrate of the IGBT 1.

Referring back to FIGS. 1 and 2, the aforementioned flat package 3 consists of a pair of common electrode plates 3a and 3b respectively exposed to the top and bottom faces of the IGBTs 1, and opposed to the emitters and collectors of the IGBTs 1. A ceramic insulating outer frame 3c is interposed between the common electrode plates 3a and 3b seal-joining those plates. The above parts are arranged so as to create a hermetic package structure. The IGBTs 1 and the freewheel diode 2 are mounted in an arrangement as shown in FIG. 2. On the common electrode plate 3b, contact terminal bodies 4 are each interposed between the common electrode plate 3a on the one side, and the emitter electrodes 1a of an IGBT 1 or the main electrode of the freewheel diode on the other side. Each contact terminal body 4 serves both as a pressing member and a heat radiator.

Referring now to FIG. 3 in addition to FIGS. 1 and 2, each contact terminal body 4 is a generally rectangular plate made of a material having superior heat and electrical conductivity, such as molybdenum. While its top face is a flat surface, the other face which contacts the IGBT 1 has two protrusions 4a that make planar contact with the emitter electrodes 1a. In addition, indentations 4b are formed on the periphery of the contact terminal body 4 so as to avoid contact with a wire leading from a gate electrode 1b (described later). The external dimensions of each contact terminal body 4 are determined in accordance with the wafer sizes of the IGBTs 1 and the freewheel diode 2 whose thicknesses are the same in accordance with the invention.

As shown in FIG. 1, the contact terminal bodies 4 are held in place in the package by positioning plate 5 made of heat-resisting resin or rubber. The positioning plate 5 is fitted in the flat package 3 such that its periphery contacts the inner wall of the insulating outer frame 3c of the package 3, and has windows at positions corresponding to the positions of the IGBTs 1 and the freewheel diode 2 so that the contact terminal bodies 4 fit within the windows. It is preferred that the positioning plate 5 have notches within each window which correspond to and engage with the indentations.

A gate wiring conductor 6 is evaporated onto the top face of an elevated wiring base that is formed in the inner wall of the insulating outer frame 3c of the flat package 3 and around the entire circumference. The gate electrodes 1b of the respective IGBTs 1 are connected to the gate wiring conductor 6 by gate wire leads 7 bonded thereto. The gate wire leads 7 do not contact the contact terminal bodies 4 because the gate wire leads 7 are led out through the indentations 4b of the terminal bodies 4. The gate wiring conductor 6 is connected to a gate external lead terminal 6a as shown in FIG. 2. The latter penetrates through the insulating outer frame 3c and extends outside of the package 3.

In accordance with the invention, the IGBTs 1 and the freewheel diode 2 are arranged in the flat package 3 in the above-described structure with an equal height. With this inventive arrangement, the IGBTs 1 and the freewheel diode 2 are uniformly pressured by the common electrode plate 3a of the flat package through the contact terminal bodies 4. Unlike in the prior art, heat generated by current conduction in the silicon substrate of the IGBT 1 is dissipated not only through the common electrode plate 3b of the package 3 on the collector side, but also through the contact terminal body 4 and the common electrode plate 3a on the emitter side. As a result, the heat dissipation in the inventive structure is much more efficient than that in a conventional bonding wire type package structure, thereby allowing a current capacity up to twice as much as the conventional structure. In addition, since no bonding wire is used to make electrical connection to the emitter in the inventive structure, the internal wiring inductance is reduced and thereby reduces the level of a voltage surge which occurs during a switching operation.

Figure 6:
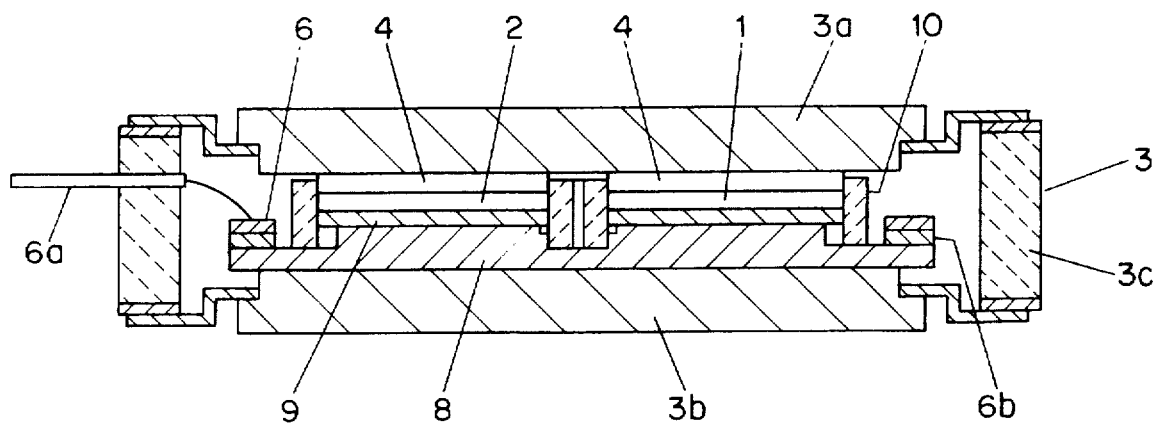
FIG. 6 shows a cross-section of an assembled structure of a second embodiment of a pressure contact type semiconductor device according to the present invention.
Figure 7:
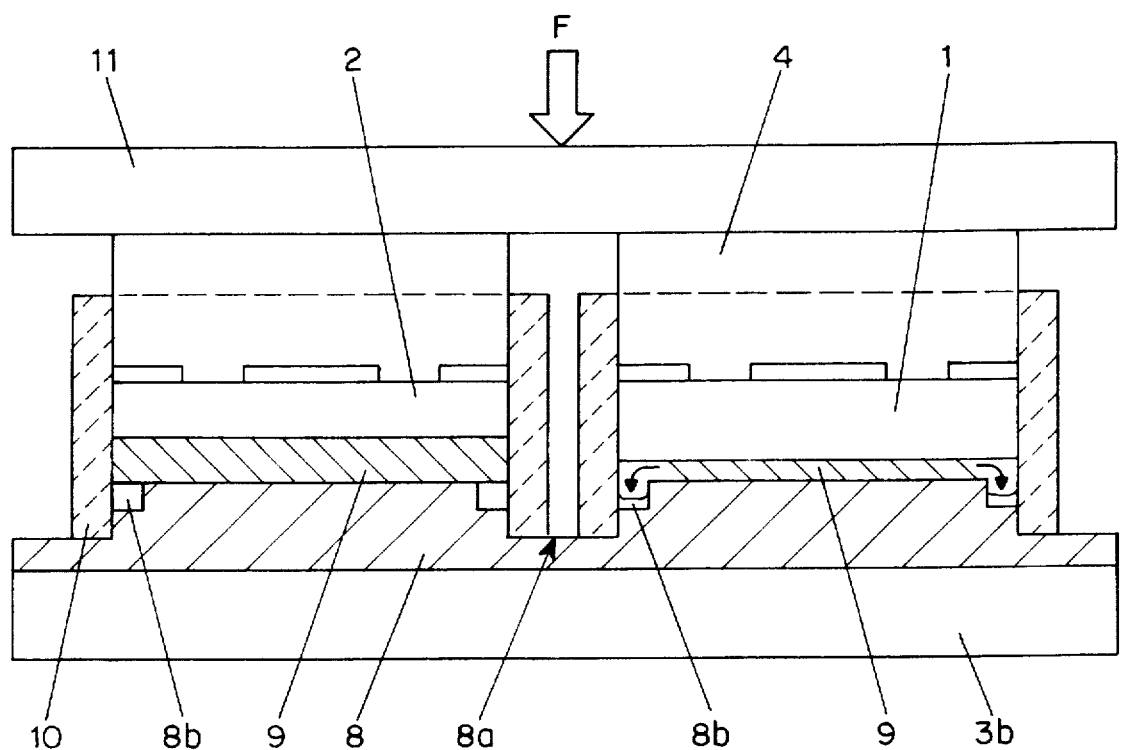
FIG. 7 illustrates an assembling method of the semiconductor device of FIG. 6.

FIGS. 6 and 7 show another embodiment according to the invention. In this embodiment, a substrate 8 for collector electrodes is provided on the common electrode plate 3b of the flat package 3, and is bonded to the IGBTs 1 and the freewheel diode 2 through solder sheets 9, such as thermoplastic conductive sheets. A wiring base for connecting the gate electrodes is provided in the periphery of the substrate 8, and a gate wiring conductor 6 similar to that in FIG. 1 is formed on the wiring base. An insulator 6b is included to insulate the gate electrode from the substrate 8. A lead terminal 6a extends from the gate wiring conductor 6 through the insulating outer frame 3c of the package 3.

Assembling guides 10 used for positioning are incorporated in the package 3, and serve to hold the respective parts, such as the semiconductor elements, the contact terminal bodies 4 and the solder sheets 9, in place. The assembling guides 10 are frames made of an insulating material, and each surrounds the respective chips of the IGBTs 1 and the freewheel diode 2. The assembling guides 10 are vertically fitted into grooves 8a with the bottom ends thereof fixed in the grooves. The grooves are carved in the top face of the substrate 8 for collector electrodes. Solder reliefs 8b are shallower grooves formed adjacent to the grooves 8a and along their inner peripheries.

The method for assembling the above device will be described with reference to FIG. 7. First, the assembling guides 10 are vertically fitted into the grooves 8a in the respective semiconductor element mounting portions defined in relation to the substrate 8 for collector electrodes. The solder sheets 9, the chips of the IGBTs 1 and the freewheel diode 2, and the contact terminal bodies 4 are sequentially inserted (stacked) into the assembling guides 10. A flat pressing plate 11 is placed across all contact terminal bodies 4. The above described assembly is pressed by a proper pressing force F exerted on the pressing plate 11 while the solder sheets 9 are externally heated to a softening temperature.

Due to heating, the solder sheets 9 become extremely malleable, and are shaped to compensate for a difference in the chip thicknesses of the IGBTs 1 and the freewheel diode 2 and variations in thickness among the respective semiconductor elements, so that the top faces of the IGBTs 1 and the freewheel diode 2 are at the same height, and also the top faces of the contact terminal bodies placed thereon are on the same plane and at the same height. At the same time, the respective semiconductor elements are soldered to the substrate 8 for collector electrodes. During the pressing operation, excessive portions of the solder sheets 9 are forced into the aforementioned solder reliefs 8b. When the thicknesses of the IGBTs 1 and the freewheel diode 2 are less different, a smaller amount of excessive solder sheet bulges out on the side of the thicker IGBTs.

Thereafter, the insulating outer frame 3c of the flat package 3 is attached to the above assembly, and the gate electrode lead for the IGBTs 1 is constructed. Finally, the common electrode plate 3a is placed on the contact terminal bodies 4, and the insulating outer frame 3 is seal-joined to the common electrodes, constituting a flat package with a hermetic structure.

Actual products of the flat package type IGBT composite module that were assembled according to the above-described assembling method were examined. It was found that variations in height among respective chips are all within an allowable range of ±50 μm.

The above assembling method using the solder sheets can also be applied to the embodiment described in connection with FIGS. 1–5. Although all of the above embodiments are directed to the IGBT module, it will be appreciated that a person skilled in the art will be able to practice the invention in numerous pressure contact type semiconductor devices in which semiconductor elements other than the IGBTs, for instance, MOS transistors and MOS-controlled thyristors, are incorporated in the flat package.

The following summarizes some of the advantages of the invention:

(1) In accordance with the invention, a plurality of semiconductor elements can be incorporated in the flat package which will permit uniform planar pressure contact without exerting excessive pressure on the control electrode structures of the semiconductor elements. Heat dissipation can be effected through the electrodes formed on both the first and second principal surfaces of each semiconductor element. As a result, the heat dissipation performance is greatly improved and the current capacity of the semiconductor device is substantially increased. Since no bonding wires are used for the connection to the main electrodes, the internal wiring inductance is reduced. This, when combined with the flat package of the hermetic structure, improves the reliability of the semiconductor device.

(2) Again, in accordance with the invention, a composite device which incorporates the IGBTs and the freewheel diode in the flat package includes even principal surfaces arranged to be on the same plane and with the same height. As a result, the IGBTs and the freewheel diode are uniformly pressured by the common electrode plate of the package through the contact terminal bodies, thereby further improving the reliability.

What is claimed is:

1. A pressure contact type semiconductor device in a flat package comprising:

at least one horizontal electrode plate;

at least a first semiconductor element and a second semiconductor element each having a plurality of layers of selected conductivity types, said first semiconductor element being different from said second semiconductor element;

means disposed between said electrode plate and said first and second semiconductor elements for contacting a first surface of said first semiconductor element opposite said electrode plate, and for contacting a second surface of said second semiconductor element opposite said electrode plate, said first surface and said second surface being substantially even with each other and on the same plane substantially parallel to said electrode plate such that said electrode plate exerts equal pressure through the contacting means on said first and second semiconductor elements in said flat package;

a second electrode plate parallel to said horizontal electrode plate;

an insulating outer frame interposed between the pair of electrode plates, the insulating outer frame connected to respective inner faces of the electrode plates; and means for positioning the contacting means in the flat package, said positioning means having windows for receiving said contacting means, the positions of said windows corresponding to the positions of said at least a first semiconductor element and a second semiconductor element, the periphery of said positioning means being in contact with an inner wall of said insulating outer frame.

2. The device according to claim 1 further comprising a control electrode wiring conductor on the inner periphery of the package and surrounding the semiconductor elements, at least one of the semiconductor elements being wire-connected to the conductor.

3. The device according to claim 2 further comprising an external lead terminal connected to the control electrode wiring conductor at one end and led outside of the flat package by penetrating through said insulating outer frame at the other end.

4. The device according to claim 1, wherein the contacting means further comprises indentations on a periphery thereof for avoiding contact with connection wires between the semiconductor elements and the control electrode wiring conductor.

5. The device according to claim 1, wherein the first semiconductor element is an insulated-gate bipolar transistor, and the second semiconductor element is a freewheel diode.

6. The device according to claim 1, wherein said first and second semiconductor elements have the same thickness.

7. The device according to claim 6 wherein substrates of the first and second semiconductor element each comprise bonded layers which are highly doped.

8. The device according to claim 1, wherein said contacting means further comprises protrusions for engaging said first and second semiconductor elements therewith.

9. A pressure contact type semiconductor device in a flat package comprising:

at least one horizontal electrode plate;

at least a first semiconductor element and a second semiconductor element each having a plurality of layers of selected conductivity types, said first semiconductor element being different from said second semiconductor element; and means disposed between said electrode plate and said first and second semiconductor elements for contacting a first surface of said first semiconductor element opposite said electrode plate, and for contacting a second surface of said second semiconductor element opposite said electrode plate, said first surface and said second surface being substantially even with each other and on the same plane substantially parallel to said electrode plate such that said electrode plate exerts equal pressure through the contacting means on said first and second semiconductor elements in said flat package, wherein grooves are provided around said at least first and second semiconductor elements, said device further comprising assembling guides fixedly connected to the grooves for holding the contacting means in place.

10. A pressure contact type semiconductor device in a flat package comprising:

at least one horizontal electrode plate;

at least a first semiconductor element and a second semiconductor element each having a plurality of layers of selected conductivity type, said first semiconductor element being different from said second semiconductor element; and means disposed between said electrode plate and said first and second semiconductor elements for contacting a first surface of said first semiconductor element opposite said electrode plate, and for contacting a second surface of said second semiconductor element opposite said electrode plate, said first surface and said second surface being substantially even with each other and on the same plane substantially parallel to said electrode plate such that said electrode plate exerts equal pressure through the contacting means on said first and second semiconductor elements in said flat package, wherein said first and second semiconductor elements have different thicknesses, said device further comprising thermoplastic conductive material which becomes malleable when heated above a predetermined temperature, surfaces of said first and second semiconductor elements opposite the respective first and second surfaces being bonded to said thermoplastic conductive material;

whereby said first and second surfaces are forced to be substantially even with each other despite said different thicknesses by heating and pressuring said thermoplastic conductive material through said contacting means.

11. The device according to claim 10 wherein space is provided to accommodate excess thermoplastic conductive material when said material is heated and pressured.

12. The device according to claim 10 wherein the thermoplastic conductive material is a solder sheet.

* * * * *

UNITED STATES PATENT AND TRADEMARK OFFICE
CERTIFICATE OF CORRECTION

PATENT NO. : 5,539,220
DATED : July 23, 1996
INVENTOR(S) : Yoshikazu Takahashi

It is certified that error appears in the above-indentified patent and that said Letters Patent is hereby corrected as shown below:

Title page, Item 73, "Hino" should read --Tokyo--;

Title page, 2nd Col., 3rd line, "Aug." should read --Sept.--;

Column 6, line 6, "wafer 2a a" should read --wafer 2a--;

Column 9, line 31, "element" should read --elements--.

Signed and Sealed this

Twenty-fourth Day of December, 1996

Attest:

BRUCE LEHMAN

Attesting Officer     Commissioner of Patents and Trademarks